(12) United States Patent
Ngo

(10) Patent No.: US 7,226,296 B2
(45) Date of Patent: Jun. 5, 2007

(54) BALL GRID ARRAY CONTACTS WITH SPRING ACTION

(75) Inventor: Hung Viet Ngo, Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/022,137

(22) Filed: Dec. 23, 2004

(65) Prior Publication Data

US 2006/0141818 A1  Jun. 29, 2006

(51) Int. Cl.
  *H01L 21/00* (2006.01)
(52) U.S. Cl. .......................... 439/71; 439/66
(58) Field of Classification Search ................ 439/83, 439/71, 874–876, 66
See application file for complete search history.

(56) References Cited

U.S. PATENT DOCUMENTS

| | | | |
|---|---|---|---|
| 3,286,220 A | 11/1966 | Marley et al. ............... 439/680 |
| 3,538,486 A | 11/1970 | Shlesinger, Jr. ............. 439/268 |
| 3,669,054 A | 6/1972 | Desso et al. ................. 113/119 |
| 3,748,633 A | 7/1973 | Lundergan .................. 339/217 |
| 3,871,015 A | 3/1975 | Lin et al. ....................... 357/67 |
| 4,076,362 A | 2/1978 | Ichimura ..................... 339/75 |
| 4,159,861 A | 7/1979 | Anhalt ........................ 339/75 |
| 4,260,212 A | 4/1981 | Ritchie et al. ............... 339/97 |
| 4,288,139 A | 9/1981 | Cobaugh et al. ............. 339/74 |
| 4,383,724 A | 5/1983 | Verhoevan ................. 439/510 |
| 4,402,563 A | 9/1983 | Sinclair ....................... 339/75 |
| 4,505,529 A * | 3/1985 | Barkus ......................... 439/82 |
| 4,545,610 A | 10/1985 | Lakritz et al. ................ 29/589 |
| 4,560,222 A | 12/1985 | Dambach ..................... 339/75 |
| 4,717,360 A | 1/1988 | Czaja ......................... 439/710 |
| 4,776,803 A | 10/1988 | Pretchel et al. ............... 439/59 |
| 4,815,987 A | 3/1989 | Kawano et al. ............. 439/263 |
| 4,867,713 A | 9/1989 | Ozu et al. .................... 439/833 |
| 4,900,271 A | 2/1990 | Colleran et al. ............. 439/595 |
| 4,907,990 A | 3/1990 | Bertho et al. ............... 439/851 |
| 4,973,271 A | 11/1990 | Ishizuka et al. ............ 439/839 |
| 5,015,946 A * | 5/1991 | Janko ......................... 324/754 |
| 5,077,893 A | 1/1992 | Mosquera et al. ........... 29/882 |
| 5,174,770 A | 12/1992 | Sasaki et al. ............... 439/108 |
| 5,238,414 A | 8/1993 | Yaegashi et al. ........... 439/108 |

(Continued)

FOREIGN PATENT DOCUMENTS

EP  0 273 683 A2  7/1988

(Continued)

OTHER PUBLICATIONS

U.S. Appl. No. 10/921,664, filed Aug. 2004, Christopher Daily et al.*

U.S. Appl. No. 10/997,129, filed Nov. 24, 2004, Stanley W. Olson, et al.

*Primary Examiner*—Tho D. Ta
*Assistant Examiner*—Vanessa Girardi
(74) *Attorney, Agent, or Firm*—Woodcock Washburn LLP

(57) ABSTRACT

An electrical contact for a ball grid array connector is disclosed for providing improved solder ball connection with a substrate. The contacts may be compressed, enabling solder balls of the connector to abut with the substrate prior to reflow. During reflow, the compression may be relieved by the contact extending further into the solder ball, returning the contact to an uncompressed state.

19 Claims, 6 Drawing Sheets

U.S. PATENT DOCUMENTS

| | | | |
|---|---|---|---|
| 5,254,012 A | 10/1993 | Wang | 439/263 |
| 5,274,918 A | 1/1994 | Reed | 29/882 |
| 5,302,135 A | 4/1994 | Lee | 439/263 |
| 5,320,549 A | 6/1994 | Schempp et al. | 439/246 |
| 5,328,381 A | 7/1994 | Seymour et al. | 439/247 |
| 5,431,578 A | 7/1995 | Wayne | 439/259 |
| 5,475,922 A | 12/1995 | Tamura et al. | 29/881 |
| 5,558,542 A | 9/1996 | O'Sullivan et al. | 439/682 |
| 5,590,463 A | 1/1997 | Feldman et al. | 29/844 |
| 5,609,502 A | 3/1997 | Thumma | 439/747 |
| 5,702,255 A | 12/1997 | Murphy et al. | 439/71 |
| 5,730,609 A | 3/1998 | Harwath | 439/108 |
| 5,741,144 A | 4/1998 | Elco et al. | 439/101 |
| 5,741,161 A | 4/1998 | Cahaly et al. | 439/709 |
| 5,746,608 A * | 5/1998 | Taylor | 439/70 |
| 5,795,191 A | 8/1998 | Preputnick et al. | 439/608 |
| 5,817,973 A | 10/1998 | Elco | 174/32 |
| 5,873,742 A | 2/1999 | McHugh | 439/74 |
| 5,908,333 A | 6/1999 | Perino et al. | 439/631 |
| 5,961,355 A | 10/1999 | Morlion et al. | 439/686 |
| 5,971,817 A | 10/1999 | Longueville | 439/857 |
| 5,975,921 A | 11/1999 | Shuey | 439/83 |
| 5,980,321 A | 11/1999 | Cohen et al. | 439/608 |
| 5,993,259 A | 11/1999 | Stokoe et al. | 439/608 |
| 6,050,862 A | 4/2000 | Ishii | 439/843 |
| 6,068,520 A | 5/2000 | Winings et al. | 439/676 |
| 6,095,827 A | 8/2000 | Dutkowsky et al. | 439/83 |
| 6,123,554 A | 9/2000 | Ortega et al. | 439/79 |
| 6,125,535 A | 10/2000 | Chiou et al. | 29/883 |
| 6,139,336 A | 10/2000 | Olson | 439/83 |
| 6,146,157 A | 11/2000 | Lenoir et al. | 439/101 |
| 6,146,202 A | 11/2000 | Ramey et al. | 439/608 |
| 6,146,203 A | 11/2000 | Elco et al. | 439/608 |
| 6,171,149 B1 | 1/2001 | Van Zanten | 439/608 |
| 6,190,213 B1 | 2/2001 | Reichart et al. | 439/736 |
| 6,212,755 B1 | 4/2001 | Shimada et al. | 29/527.1 |
| 6,219,913 B1 | 4/2001 | Uchiyama | 29/883 |
| 6,220,896 B1 | 4/2001 | Bertoncici et al. | 439/608 |
| 6,259,039 B1 | 7/2001 | Chroneos, Jr. et al. | 174/263 |
| 6,269,539 B1 | 8/2001 | Takahashi et al. | 29/883 |
| 6,274,474 B1 | 8/2001 | Caletka et al. | 438/613 |
| 6,293,827 B1 | 9/2001 | Stokoe et al. | 439/608 |
| 6,319,075 B1 | 11/2001 | Clark et al. | 439/825 |
| 6,328,602 B1 | 12/2001 | Yamasaki et al. | 439/608 |
| 6,347,952 B1 | 2/2002 | Hasegawa et al. | 439/608 |
| 6,350,134 B1 | 2/2002 | Fogg et al. | 439/79 |
| 6,363,607 B1 | 4/2002 | Chen et al. | 29/883 |
| 6,371,773 B1 | 4/2002 | Crofoot et al. | 439/79 |
| 6,379,188 B1 | 4/2002 | Cohen et al. | 439/608 |
| 6,409,543 B1 | 6/2002 | Astbury, Jr. et al. | 439/608 |
| 6,431,914 B1 | 8/2002 | Billman | 439/608 |
| 6,435,914 B1 | 8/2002 | Billman | 439/608 |
| 6,461,202 B2 | 10/2002 | Kline | 439/701 |
| 6,471,548 B2 | 10/2002 | Bertoncini et al. | 439/608 |
| 6,506,081 B2 | 1/2003 | Blanchfield et al. | 439/682 |
| 6,537,111 B2 | 3/2003 | Brammer et al. | 439/857 |
| 6,540,522 B2 | 4/2003 | Sipe | 439/61 |
| 6,543,129 B2 * | 4/2003 | Cachina et al. | 29/843 |
| 6,551,112 B1 * | 4/2003 | Li et al. | 439/66 |
| 6,554,647 B1 | 4/2003 | Cohen et al. | 439/607 |
| 6,565,364 B1 * | 5/2003 | Yun | 439/71 |
| 6,572,410 B1 | 6/2003 | Volstorf et al. | 439/608 |
| 6,652,318 B1 | 11/2003 | Winings et al. | 439/608 |
| 6,663,426 B2 | 12/2003 | Hasircoglu et al. | 439/608 |
| 6,692,272 B2 | 2/2004 | Lemke et al. | 439/108 |
| 6,702,594 B2 | 3/2004 | Lee et al. | 439/83 |
| 6,739,918 B2 | 5/2004 | Cohen et al. | 439/701 |
| 6,743,037 B2 | 6/2004 | Kassa et al. | 439/342 |
| 6,746,278 B2 | 6/2004 | Nelson et al. | 439/608 |
| 6,899,548 B2 | 5/2005 | Houtz | 439/71 |
| 2003/0013330 A1 | 1/2003 | Takeuchi | 439/83 |
| 2003/0143894 A1 | 7/2003 | Kline et al. | 439/608 |
| 2003/0220021 A1 | 11/2003 | Whiteman, Jr. et al. | 439/608 |
| 2004/0183094 A1 | 9/2004 | Caletka et al. | 257/178 |
| 2005/0215121 A1 | 9/2005 | Tokunaga | 439/608 |
| 2006/0057897 A1 | 3/2006 | Minich et al. | 439/701 |
| 2006/0103021 A1* | 5/2006 | Liu et al. | 257/738 |

FOREIGN PATENT DOCUMENTS

| | | |
|---|---|---|
| JP | 06-236788 | 8/1994 |
| JP | 07-114958 | 5/1995 |
| JP | 2000-003743 | 1/2000 |
| JP | 2000-003744 | 1/2000 |
| JP | 2000-003745 | 1/2000 |
| JP | 2000-003746 | 1/2000 |
| WO | WO 01/29931 A1 | 4/2001 |
| WO | WO 01/39332 A1 | 5/2001 |

* cited by examiner

FIG. 4
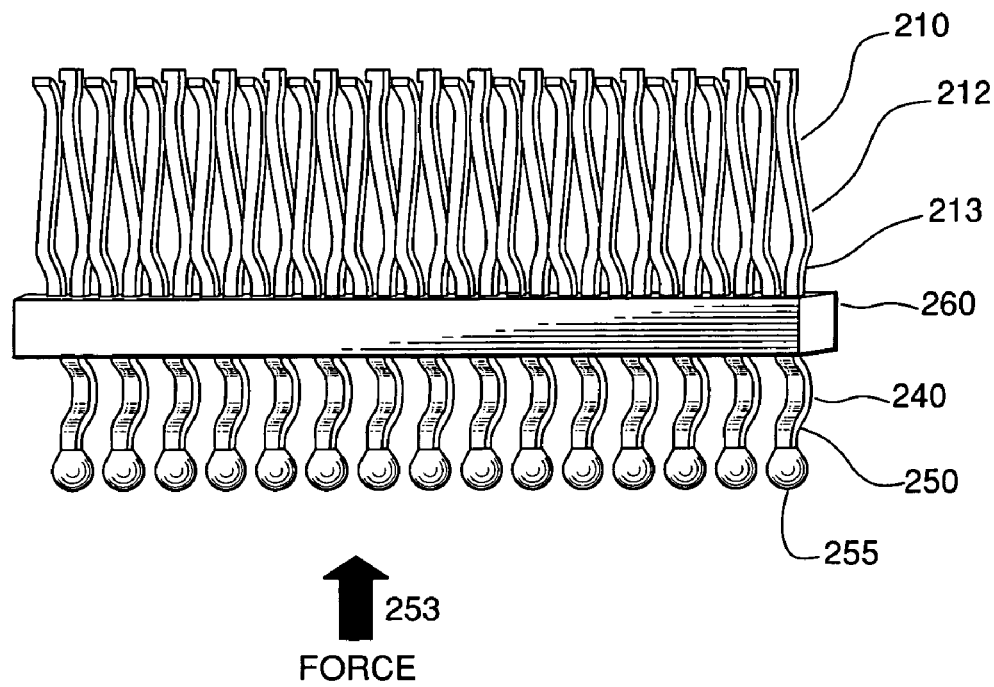
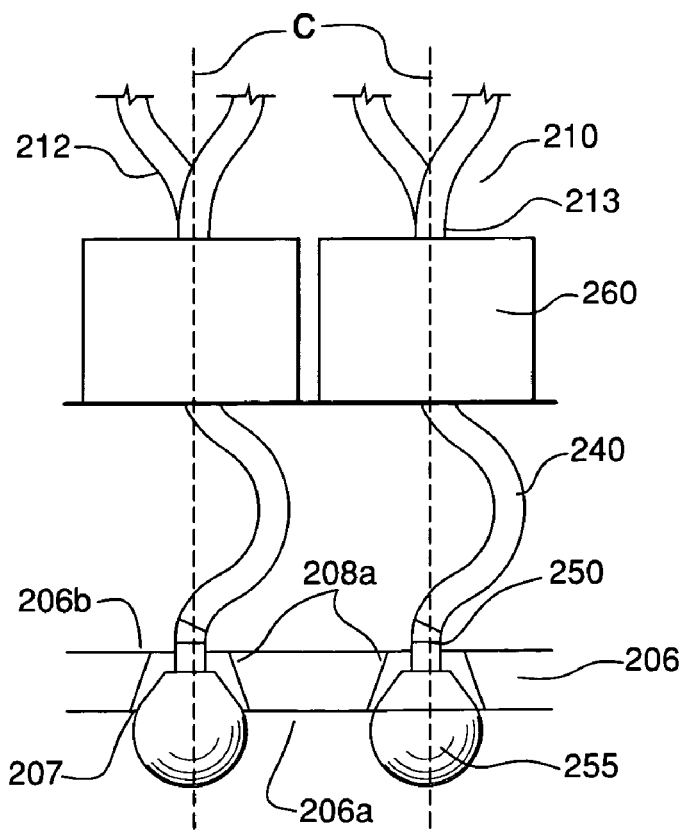
FIG. 5

BALL GRID ARRAY CONTACTS WITH SPRING ACTION

CROSS-REFERENCE TO RELATED APPLICATIONS

The subject matter disclosed in this patent application is related to the subject matter disclosed in U.S. patent application Ser. No. 10/921,664, filed on Aug. 19, 2004 and entitled "Electrical Connector With Stepped Housing," assigned to the assignee of the present application, the content of which is herein incorporated by reference in its entirety.

FIELD OF THE INVENTION

The invention relates generally to electrical connectors. More specifically, the invention relates to ball grid array contacts with spring action for promoting electrical connection with substrates.

BACKGROUND OF THE INVENTION

Each contact of a ball grid array (BGA) connector may have a solder ball fixed to an end thereof. The solder balls may be located directly below a connector housing and form a grid array. The BGA connector may be mounted on a circuit substrate, e.g., a printed wiring board, by aligning the BGA with a corresponding array of electrical contact points, e.g., solder pads, on a surface of the substrate. The solder balls may be reflowed to form a solder joint between each connector contact and a corresponding electrical contact point.

The solder balls, however, may not be uniform in shape, size, or location on the contact. This lack of uniformity in the BGA connector may prevent some solder balls from firmly abutting the substrate during reflow.

Therefore, there is a need for a BGA connector and a reflow method that enables the connector to uniformly connect with a substrate.

SUMMARY OF THE INVENTION

The invention provides a BGA contact and a reflow method that may enable the solder balls of a connector to abut and electrically connect with a substrate. The invention provides a BGA contact that may include a tail end for extending into a solder ball, a middle portion by which the contact is held in the connector housing, and a spring beam located between the tail end and the middle portion. The spring beam may compress when a force is applied on the tail end of the contact in a direction parallel to the contact and toward the middle portion. In this way, force may be applied on the connector after the connector is placed on the substrate but before reflow commences. The force will compress (i.e., temporarily shorten) the contacts that are abutting the substrate, allowing other solder balls that may not initially touch the substrate to abut the substrate. As force is applied to the connector, the contacts may be compressed until the shortest solder ball abuts the substrate.

The invention also provides a method of connecting a BGA connector to a substrate. Such a method may include placing the connector on the substrate and applying a force on the connector until each solder ball abuts the substrate. During reflow, the solder balls soften, and the contacts compressed during application of the force may relax.

BRIEF DESCRIPTION OF THE DRAWINGS

FIG. 4 depicts a second example embodiment of a connector strip and contacts in accordance with the invention.

FIG. 5 is a cutaway side view of two example contacts held in respective connector strips and protruding through apertures in a BGA tray.

DETAILED DESCRIPTION OF ILLUSTRATIVE EMBODIMENTS

Figure 1:
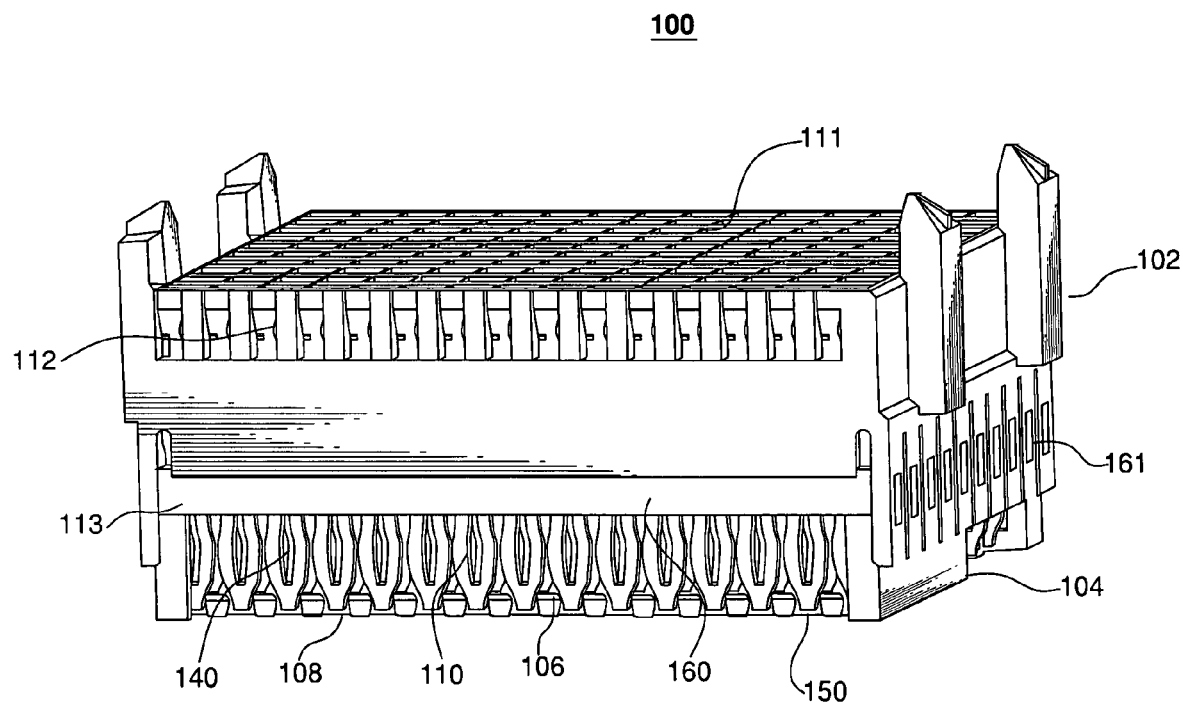
FIG. 1 depicts an example embodiment of a connector receptacle according to the invention.

FIG. 1 depicts an example embodiment of a receptacle connector 100 according to the invention. The receptacle connector 100 may include an upper housing 102 and a lower housing 104. The upper housing 102 may house receptacle ends 112 of contacts 110. The upper housing 102 may have contact receiving apertures 111 for receiving complementary contacts (not shown) that may be inserted into respective receptacle portions 112.

The lower housing 104 may be connected to the upper housing 102 by any suitable method, such as through an interlocking mechanism, for example. The lower housing 104 may house tail ends 150 and spring beams 140 of the contacts 110. The lower housing 104 may include a BGA tray 106. The BGA tray 106 may include apertures 108, with each aperture 108 corresponding to a respective tail end 150 of a contact 110. The tail end 150 may protrude or partially protrude through the aperture 108. The upper housing 102, lower housing 104, and BGA tray 106 may be constructed of plastic, for example.

Each contact 110 may be held in the connector receptacle 100 by a connector strip 160. The connector strip 160 may hold the contact 110 at a middle portion 113 of the contact 110. The connector strip 160 may be made of plastic, for example. Each contact middle portion 113 may be molded as part of the connector strip 160 or otherwise may be inserted into the connector strip 160 such that the contact 110 is prevented from movement within the connector receptacle 100. The connector strip 160 may be secured to the upper housing 104 through an interlocking mechanism 161 or by any suitable method.

Figure 2:
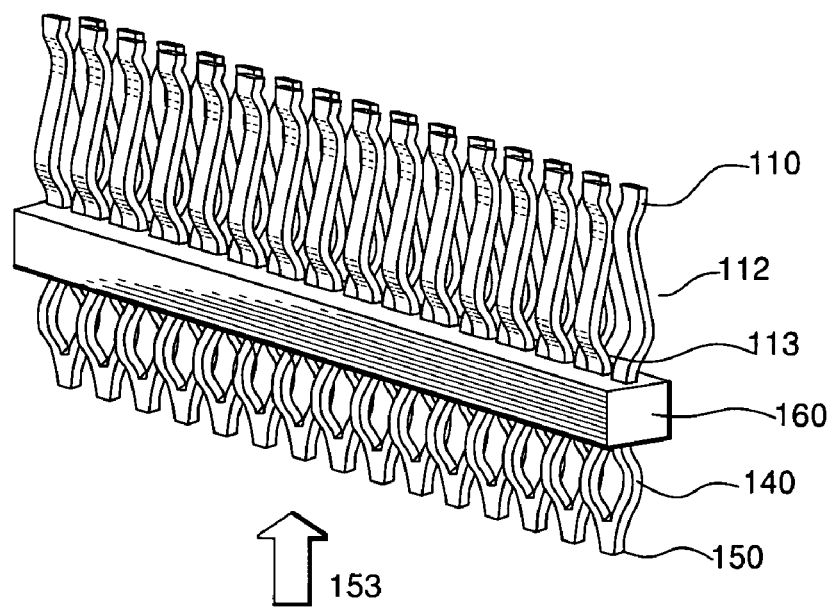
FIG. 2 depicts a first example embodiment of a connector strip and contacts in accordance with the invention.
Figure 3:
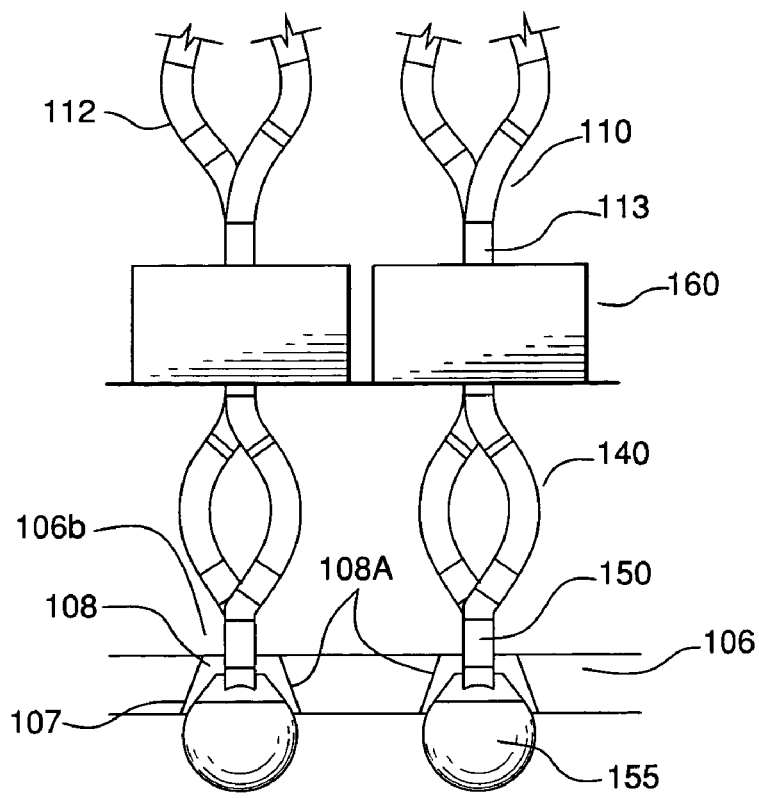
FIG. 3 is a cutaway side view of two example contacts held in respective connector strips and protruding through apertures in a BGA tray.

FIGS. 2 and 3 depict a first example embodiment of a connector strip and contacts in accordance with the invention. FIG. 2 depicts an example connector strip 160 with contacts 110. FIG. 3 is a cutaway side view of two example contacts 110 held in respective connector strips 160 and protruding through the apertures 108 in the BGA tray 106. The contacts 110 may include a contact receiving portion 112, a middle portion 113, a double spring beam 140, and a tail end 150. The contacts 110 may be used for either differential or single-ended signal transmission. A solder ball 155 may be attached to the tail end 150 by any suitable method, such as, for example, by heating the solder ball 155 to soften it, attaching the ball 155 onto the tail end 150 and allowing the ball 155 to cool and harden.

Each contact 110 may include a double spring beam 140 located between the middle portion 113 and the tail end 150. The double spring beam 140 may be formed by bending the contact into two opposing "C" shapes or arcs such that each double spring beam 140 forms a generally oval shaped aperture through the contact 110. Those skilled in the art will recognize that other shapes may be used to form the double spring beam 140 and that the double spring beam 140 shown in FIGS. 2 and 3 is just one example. The contact 110 may be stamped or otherwise formed from a sheet of conductive material.

The double spring beam 140 may be formed or constructed such that, when a compression force is applied along the longitudinal axis of the contact (i.e., in a direction as shown by the arrow 153), the double spring beam 140 may act as a stiff spring, allowing the force to compress the contacts 110 toward the connector strip 160. Such compression force may be created when the connector 100 is pressed onto a substrate in a direction opposite the direction shown by the arrow 153. As the connector 100 is pressed onto a substrate, each contact 110 having a ball that abuts the substrate may compress, that is, shorten along its longitudinal axis so that other balls of other shorter contacts 110 may abut the substrate. Because each contact 110 is firmly held within the connector 160 by the connector strip 160, the spring beam 140 of each contact 110 may absorb or compensate for the compression force while the receptacle portion 112 of each contact remains substantially unaltered by the force. The compression force may be applied until each ball 155 abuts a respective electrical contact point on the substrate.

Each aperture 108 of the BGA tray 106 may include tapered sidewalls 108a such that the aperture is larger at a substrate side 106a of the BGA tray 106 than at the connector strip side 106b. When the solder ball 155 is placed on the tail end 150 of the contact 110, it may be positioned such that it does not penetrate into the aperture 108 or such that it partially penetrates into the aperture 108. Additionally, the aperture 108 may be slightly larger than the ball 155 on the substrate side 106a of the tray 106. In this way, a gap 107 may be formed between the sidewalls 108a of the aperture 108 and the ball 155. This gap 107 may serve two purposes. First, when the balls 155 are soldered to a substrate, the compression force may be applied and may push the ball 155 into the aperture 108. The tapered sidewalls 108a combined with the gap 107 may allow the ball 155 to be pushed in the direction of the arrow 153 without being pressed against the BGA tray 106. Second, the gap 107 may provide flexibility after the connector 100 is connected to a substrate. The flexibility may allow the contacts 110 to move laterally in the connector 100 as the connector 100 and its attached substrate are moved around, connected to another connector, placed in a component, etc. The gap 107 may allow each contact 110 to move, which may help alleviate stress on a joint formed between each ball 155 and its respective electrical contact point on the substrate. This stress relief may aid in maintaining electrical connectivity between the connector 100 and the substrate.

FIGS. 4 and 5 depict a second example embodiment of a connector strip and contacts in accordance with the invention. FIG. 4 depicts an example connector strip 260 and contacts 210. FIG. 5 is a cutaway side view of two example contacts 210 held in respective connector strips 260 and protruding through apertures 208 in a BGA tray 206.

The contacts 210 may include a contact receiving portion 212, a middle portion 213, a single spring beam 240, and a tail end 250. The contacts 210 may be used for either differential or single-ended signal transmission. A solder ball 255 may be attached to the tail end 250 by, for example, heating the solder ball 255 to soften it, attaching the ball 255 onto the tail end 250 and allowing the ball 255 to cool and harden.

Each contact 210 may include a single spring beam 240 located between the middle portion 213 and the tail end 250. The single spring beam 240 may be formed by bending the contact into a "C" shape or arc. Those skilled in the art will recognize that other shapes may be used to form the single spring beam 240 offset from a centerline c of the contact. The contact 210 may be stamped or otherwise formed from a sheet of conductive material.

The single spring beam 240 may be formed or constructed such that, when a compression force is applied along the longitudinal axis of the contact (i.e., in a direction as shown by the arrow 253), the single spring beam 240 may allow the force to compress the contacts 210 toward the connector strip 260. Such compression force may be created when the connector is pressed onto a substrate in a direction opposite of the direction shown by the arrow 253. As the connector is pressed onto a substrate, each contact 210 having a ball that abuts the substrate may compress, that is, shorten so that other balls of other shorter contacts 210 may abut the substrate. Because each contact 210 is firmly held by the connector strip 260, the spring beam 240 may absorb or compensate for the compression force while the receptacle portions 212 of each contact remain substantially unaltered by the force. The force may be applied until each ball 255 is abutting a respective electrical contact point on the substrate. Each aperture 208 of the BGA tray 206 may include tapered sidewalls 208a such that the aperture 208 is larger at a substrate side 206a of the tray 206 than at the connector strip side 206b. When the solder ball 255 is placed on the tail end 250 of the contact 210, it may be positioned such that it does not penetrate into the aperture 208 or such that it partially penetrates into the aperture 208. Additionally, the aperture 208 may be slightly larger than the ball 255 on the substrate side 206a of the tray 206. In this way, a gap 207 may be formed between the sidewalls 208a of the aperture 208 and the ball 255. This gap 207 may serve the purposes as described with regard to the gap 107 of FIG. 3.

Figure 6:
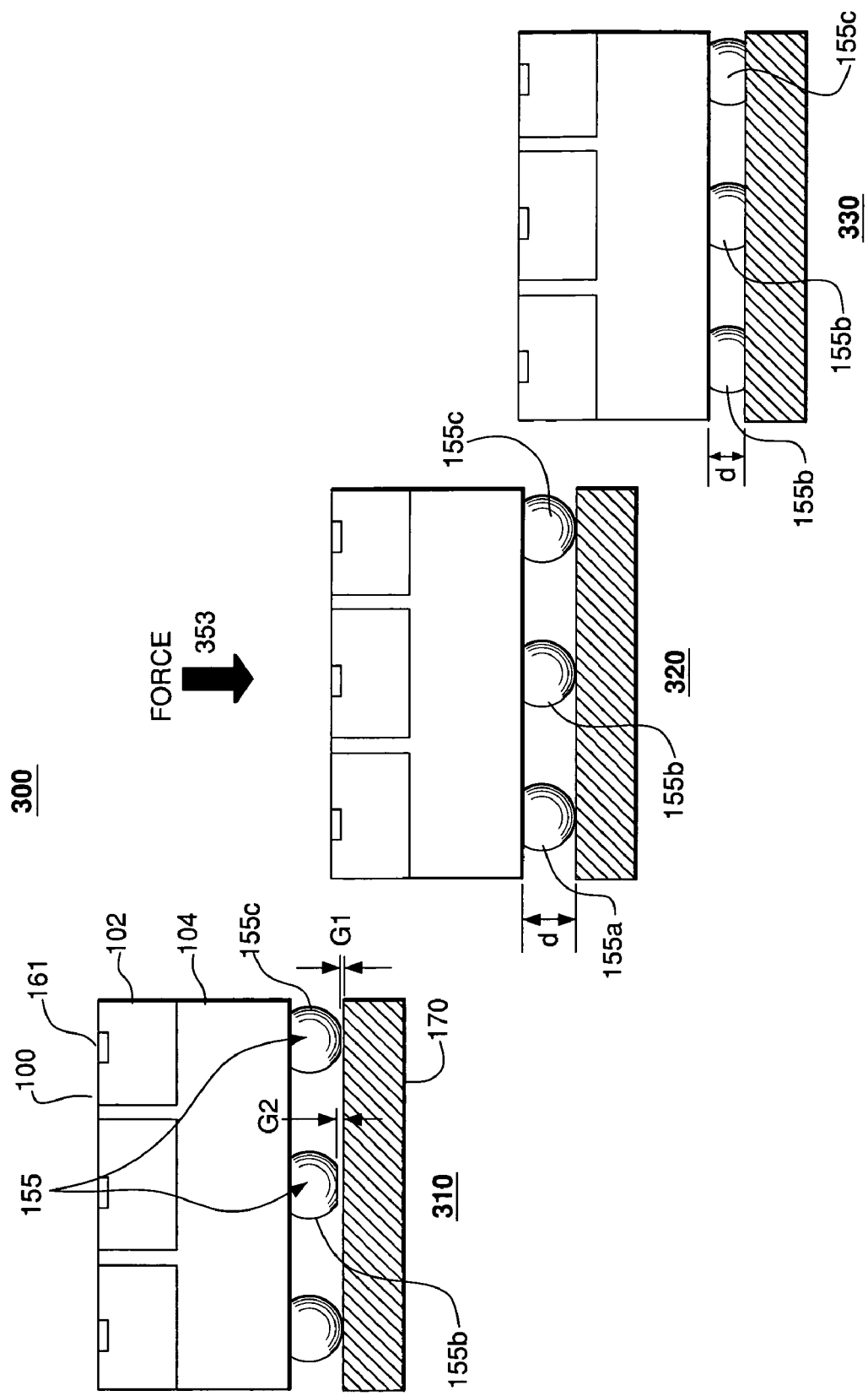
FIG. 6 depicts an example embodiment of a method according to the invention for electrically connecting a connector to a substrate.

FIG. 6 depicts an example method 300 for electrically connecting the connector 100 to a substrate 170 in accordance with one embodiment of the invention. The method 300 is described with regard to the contact 110 and the double spring beam 140 but may be applicable to the contact 210 and the single spring beam 240, or to any other contact configuration in any alternative embodiment of the invention.

FIG. 6 depicts an end view of the connector 100 in the vicinity of the lower housing 104 and the locking mechanism 161 that physically connects the connector strip 160 to the upper housing 102 as described with regard to FIG. 1. Three solder balls are shown during three steps 310, 320, 330 of the method 300.

The method 300 may start at step 310 by placing the connector 100 on the substrate 170 which may be a PCB. A solder ball 155a may abut the substrate 170, while two other solder balls 155b, 155c may not touch the substrate 170. Gaps G2, G1 may be formed between the respective solder balls 155b, 155c and the substrate 170 because, for example, the solder balls 155b, 155c may not be perfectly spherical, may be slightly smaller than solder ball 155a, or may be placed closer to or further into respective apertures 108 than the solder ball 155a. Additionally, the gaps G2, G1 may be formed because the substrate 170 may not be true or flat.

At step 320, a force in the direction of the arrow 353 may be placed on the connector 100, pressing the connector 100 onto the substrate 170. The force in the direction of the arrow 353 may create a compression force in a direction opposite the arrow 353 on the contacts 110 that abut the substrate 170. Because, for example, the ball 155*a* abuts the substrate 170 before the force is applied, when force is applied, the corresponding compression force in the direction opposite the arrow 353 may compress the contact 110 on which the ball 155*a* is disposed. The double spring beam 140 of the contact 110 may enable the contact 110 to compress. That is, the contact 110 may be compressed because the double spring beam 140 may bend such that the generally oval shape in the double spring beam 140 may become more circular and the respective "C" shapes within the double spring beam 140 may become more pronounced. As the contact 110 corresponding to the ball 155*a* is compressed, the solder balls 155*b*, 155*c* may come into contact with the substrate 170, as shown at step 320. If other solder balls 155 (not shown) are not abutting the substrate 170 when the solder balls 155*a*, 155*b*, 155*c* are abutting, then the compression force may continue to be applied until all solder balls 155 abut.

At step 330, reflow may commence and be completed, electrically and physically connecting each solder ball 155 to a respective electrical connecting point of the substrate 170. During reflow, a distance d from the substrate to a reference point on the connector (such as, for example, the connector strip side 106*b* of the BGA tray 106) should preferably remain constant. In this way, as the solder balls 155 become soft during reflow, the compressed contacts 110 may decompress as the tail end 150 of each compressed contact 110 moves in a direction toward the substrate 170. The tail end 150 may continue to move toward the substrate 170 until the contact 110 returns to a relaxed, uncompressed state. For example, a contact 110 may be forced into the solder ball 155*a* such that, when the reflow is completed and the solder ball 155*a* hardens, the contact 110 extending into the solder ball 155*a* is in a relaxed, uncompressed state. In this way, prior to reflow, the double spring beams 140 provide flexibility in the contacts 110 to allow the connector 100 to be pressed firmly against the substrate 170, enabling all solder balls 155 to abut the substrate 170. During reflow, the softening of the solder balls 155 may allow any compressed contacts 110 to extend further toward the substrate 170, alleviating the compression and allowing the contact to returned to a relaxed state.

Figure 7:
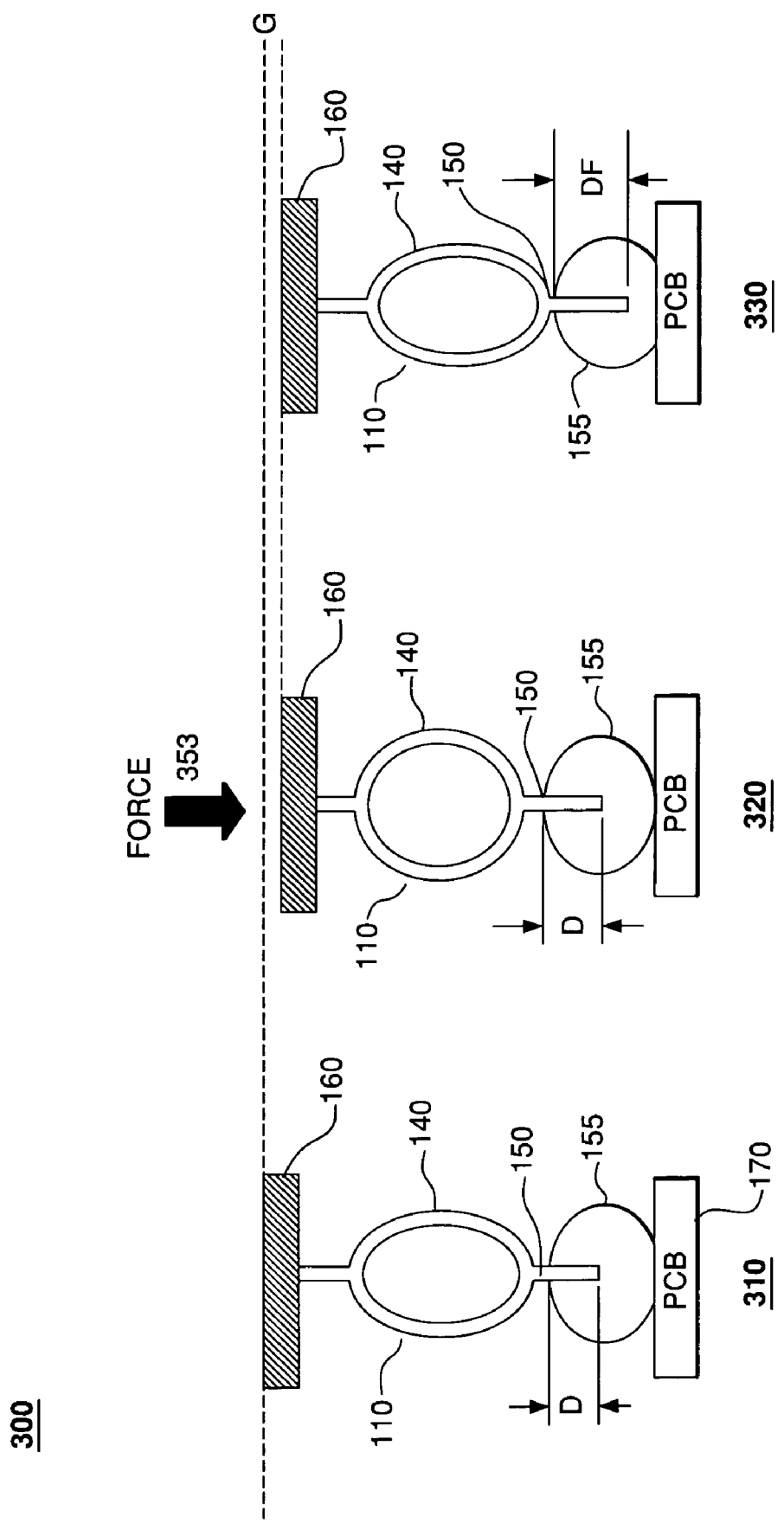
FIGS. 7 & 8 depict applications of example methods to contacts in accordance with embodiments of the invention.

FIG. 7 depicts the application of the example method 300 to the single contact 110 in accordance with an embodiment of the invention. The contact 110 includes the double spring beam 140 that is generally in the shape of an oval. At step 310, a connector such as the connector 100 may be placed on the substrate 170, and the contact 110 may abut the substrate 170. The contact 110 may have the tail end 150 initially inserted into a solder ball 155 a distance D. Other contacts (not shown) of the connector may not abut the substrate 170 when the connector 100 is placed on the substrate. The tail end 150 may define a sharp or other small area shape.

At step 320, a force in the direction of the arrow 353 may be placed on the connector 100, pressing the connector 100 onto the substrate 170. The force in the direction of the arrow 353 may create a compression force in a direction opposite the arrow 353 on the contact 110 that abuts the substrate 170. The force may compress the double spring beam 140 of the contact 110 and may bend the double spring beam 140 such that the generally oval shape may become more circular and the respective "C" shapes within the double spring beam 140 may become more pronounced. The force may compress the contact 110 such that it is shorter than during its original uncompressed state by a distance G. As the contact 110 is compressed, the solder balls of other contacts (not shown) in the connector 100 that did not initially abut the substrate 170 may come into contact with the substrate 170.

At step 330, reflow may commence and be completed, electrically and physically connecting the solder ball 155 of the contact 110 and other contacts of the connector 100 to respective electrical connecting points of the substrate 170. The solder ball 155 may become soft during reflow, allowing the compressed contact 110 to decompress as the tail end 150 of the contact 110 extends in a direction toward the substrate 170 until the contact 110 returns to a relaxed, uncompressed state. At the conclusion of reflow, the tail end 150 of the contact 110 may extend into the solder ball 155 a distance DF which may be greater than the distance D prior to reflow. In this way, the contact 110 may, upon returning to its relaxed state after reflow, remain the distance G shorter than in its original uncompressed state.

Figure 8:
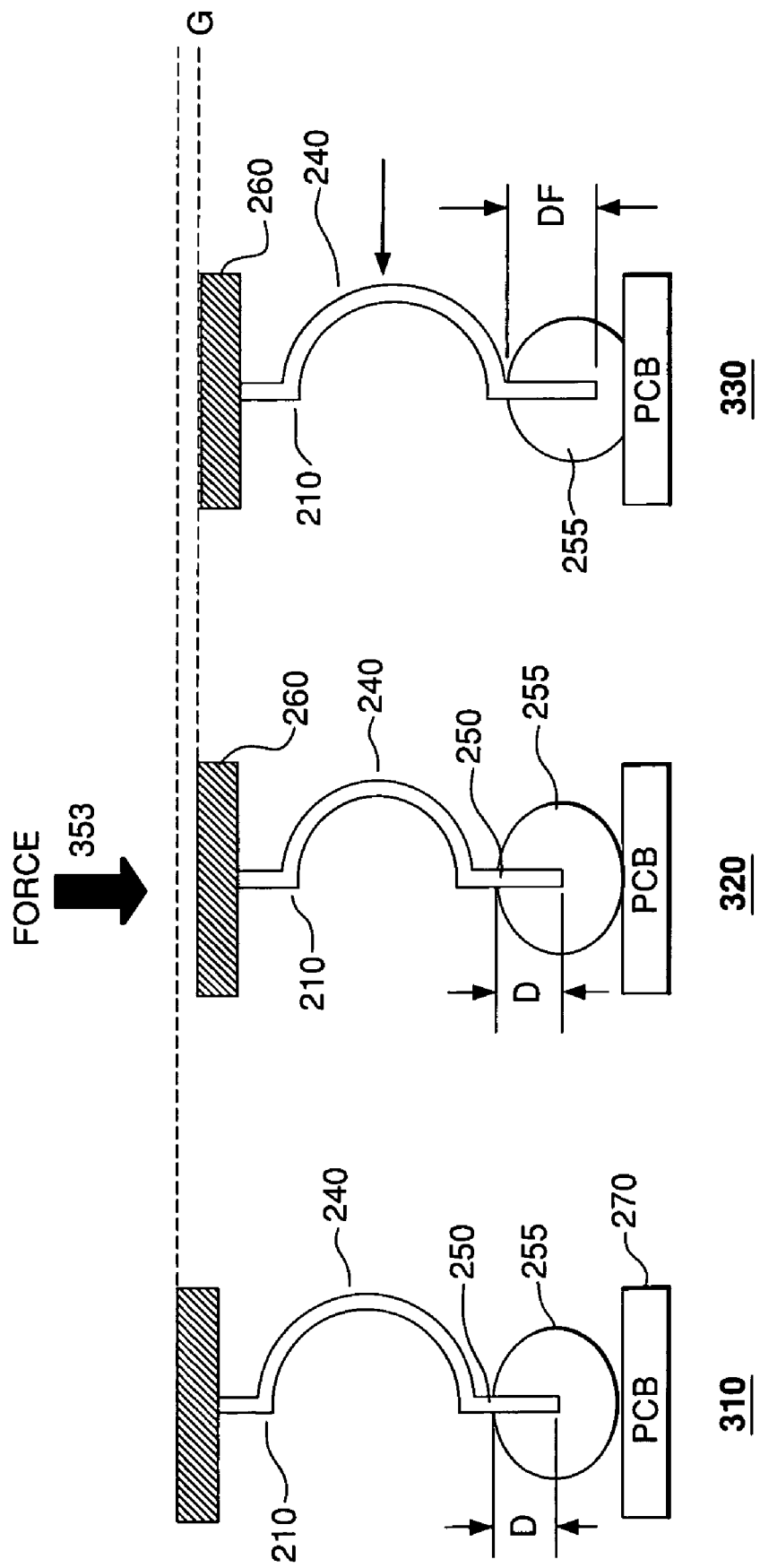

FIG. 8 depicts the application of the example method 300 to a single contact 210 in accordance with an embodiment of the invention. The contact 210 may include the single spring beam 240 that is generally in the shape of a "C" or arc. At step 310, a connector such as the connector 100 may be placed on the substrate 270, and the contact 210 may abut the substrate 270. The contact 210 may have its tail end 250 inserted into a solder ball 255 a distance D. Other contacts (not shown) of the connector 100 may not abut the substrate 270 when the connector 100 is placed on the substrate.

At step 320, a force in the direction of the arrow 353 may be placed on the connector 100, pressing the connector 100 onto the substrate 270. The force in the direction of the arrow 353 may create a compression force in a direction opposite the arrow 353 on the contact 210 that abuts the substrate 270. The force may compress the single spring beam 240 of the contact 210 and may bend the single spring beam 240 such that the "C" or arc shape may become more pronounced. The force may compress the contact 210 such that it is shorter than during its original uncompressed state by a distance G. As the contact 210 is compressed, the solder balls of other contacts (not shown) in the connector 100 that did not initially abut the substrate 270 may come into contact with the substrate 270.

At step 330, reflow may commence and be completed, electrically and physically connecting the solder ball 255 of the contact 210 and other contacts of the connector 100 to respective electrical connecting points of the substrate 270. The solder ball 255 may become soft during reflow, allowing the compressed contact 210 to decompress as the tail end 250 of the contact 210 extends in a direction toward the substrate 270 until the contact 210 returns to a relaxed, uncompressed state. At the conclusion of reflow, the tail end 250 of the contact 210 may extend into the solder ball 255 a distance DF which may be greater than the distance D prior to reflow. In this way, the contact 210 may, upon returning to its relaxed state after reflow, remain the distance G shorter than in its original state.

Thus there have been described improved contact designs and methods suitable for BGA connectors. It is to be understood that the foregoing illustrative embodiments have been provided merely for the purpose of explanation and are in no way to be construed as limiting of the invention. For example, two embodiments of spring beams 140, 240 have been described. Those skilled in the art will recognize that any contact shape facilitating compression before reflow and providing resiliency to spring back during reflow would be in accordance with alternative embodiments of the invention. The contact tail ends can be attached to an outside surface of the solder balls during the first reflow of the solder balls onto the contacts, and then pierce the liquefied solder balls during the second reflow of the connector to the substrate. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

What is claimed is:

1. An electrical connector, comprising:
   a housing;
   an electrical contact received in the housing, the electrical contact comprising:
     a tail end attached to a solder ball, the tail end defining a sharp edge, and
     a spring beam having a first length, wherein the spring beam compresses to a second length when a compressive force is applied on the electrical connector in a direction parallel with the electrical contact, the second length being shorter than the first length; and
   a BGA tray comprising,
     a BGA tray housing side that faces away from the solder ball,
     a BGA tray substrate side that faces toward the solder ball, and
     a tapered aperture comprising sidewalls, the tapered aperture extending through the BGA tray from the BGA tray housing side to the BGA tray substrate side, wherein the tapered aperture is larger on the BGA tray substrate side than on the BGA tray housing side.

2. The electrical connector of claim 1, wherein the spring beam returns to the first length when the compressive force is removed.

3. The electrical connector of claim 1, wherein the spring beam is a single spring beam.

4. The electrical connector of claim 1, wherein the spring beam is a double spring beam.

5. The electrical connector of claim 1, wherein the tail end is inserted into the solder ball.

6. The electrical connector of claim 1, wherein the electrical contact at least partially extends through the tapered aperture, and
   wherein a gap is disposed between the sidewalls of the aperture and the solder ball.

7. The electrical connector of claim 1, wherein the aperture is larger than the solder ball on the BGA tray substrate side.

8. The electrical connector of claim 1, wherein the aperture is smaller than the solder ball on the BGA tray housing side.

9. An electrical connector, comprising:
   a housing;
   an electrical contact received in the housing defining;
     a tail end attached to a solder ball,
   a tray defining,
     a tray housing side that faces toward the housing,
     a tray substrate side that faces away from the housing, and
     a tapered aperture having sidewalls, the tapered aperture extending through the tray from the tray housing side to the tray substrate side, wherein the tapered aperture is larger on the tray substrate side than on the tray housing side, and wherein the electrical contact extends into the tapered aperture.

10. The electrical connector of claim 9, wherein the electrical contact extends in a first direction and defines a spring beam having a first length, wherein the spring beam compresses to a second length when a compressive force is applied on the electrical connector in a direction parallel to the first direction.

11. The electrical connector of claim 10, wherein the electrical contact further defines a receptacle portion, wherein the length of the receptacle portion remains unchanged when the compressive force is applied to the electrical contact.

12. The electrical connector of claim 10, wherein the spring beam returns to the first length when the compressive force is removed.

13. The electrical connector of claim 10, wherein the spring beam is a double spring beam.

14. The electrical contact of claim 9, wherein the tail end extends into the solder ball and wherein the electrical contact defines a spring beam that compresses when a compressive force is applied to the contact in a first direction.

15. The electrical connector of claim 14, wherein the tail end moves in the first direction when the compressive force is applied and the solder ball is heated.

16. An electrical connector, comprising:
    a housing;
      an electrical contact received in the housing and defining a tail end attached to a solder ball and a spring beam having a first length, wherein the spring beam compresses to a second length when a compressive force is applied on the electrical connector in a direction parallel with the electrical contact; and
      a BGA tray defining a BGA tray housing side that faces away from the solder ball, a BGA tray substrate side that faces toward the solder ball, and a tapered aperture extending through the BGA tray from the BGA tray housing side to the BGA tray substrate side, wherein the electrical contact extends into the tapered aperture.

17. The electrical connector of claim 16, wherein the aperture is larger on the BGA tray substrate side than on the BGA tray housing side.

18. The electrical connector of claim 17, wherein the aperture is larger than the solder ball on the BGA tray substrate side.

19. The electrical connector of claim 17, wherein the aperture is smaller than the solder ball on the BGA tray housing side.

* * * * *